(12) United States Patent
Yasuzato

(10) Patent No.: US 7,810,066 B2
(45) Date of Patent: Oct. 5, 2010

(54) IRRADIATION PATTERN DATA GENERATION METHOD, MASK FABRICATION METHOD, AND PLOTTING SYSTEM

(75) Inventor: Tadao Yasuzato, Chuo-ku (JP)

(73) Assignee: Elpida Memory, Inc., Tokyo (JP)

(*) Notice: Subject to any disclaimer, the term of this patent is extended or adjusted under 35 U.S.C. 154(b) by 422 days.

(21) Appl. No.: 11/866,699

(22) Filed: Oct. 3, 2007

(65) Prior Publication Data

US 2008/0149859 A1 Jun. 26, 2008

(30) Foreign Application Priority Data

Oct. 6, 2006 (JP) .............................. 2006-274779

(51) Int. Cl.
*G06F 17/50* (2006.01)
(52) U.S. Cl. .......................................... 716/21; 716/19
(58) Field of Classification Search .................. 716/7, 716/19, 21; 250/492; 430/5
See application file for complete search history.

(56) References Cited

U.S. PATENT DOCUMENTS

| 4,895,780 | A | * | 1/1990 | Nissan-Cohen et al. | 430/5 |
| 5,241,185 | A | * | 8/1993 | Meiri et al. | 250/492.2 |
| 6,503,671 | B1 | * | 1/2003 | Nakajima | 430/30 |
| 6,845,497 | B2 | * | 1/2005 | Murai et al. | 716/20 |
| 7,073,161 | B2 | * | 7/2006 | Dulman et al. | 716/19 |
| 7,086,031 | B2 | * | 8/2006 | Dulman et al. | 716/19 |
| 7,669,174 | B2 | * | 2/2010 | Emi et al. | 716/20 |
| 2007/0192757 | A1 | * | 8/2007 | Emi et al. | 716/20 |

FOREIGN PATENT DOCUMENTS

| JP | 04-026109 A | 1/1992 |
| JP | 04-307723 A | 10/1992 |
| JP | 5-36595 A | 2/1993 |
| JP | 05-198485 A | 8/1993 |
| JP | 08-321450 A | 12/1996 |
| JP | 11-307429 A | 11/1999 |
| JP | 2000-241958 A | 9/2000 |
| JP | 2003-151885 A | 5/2003 |
| JP | 2003-273001 A | 9/2003 |

* cited by examiner

*Primary Examiner*—Sun J Lin
(74) *Attorney, Agent, or Firm*—Sughrue Mion, PLLC

(57) ABSTRACT

An irradiation pattern data generation method includes: a process for providing a design pattern having diagonal side portions that extend diagonally with respect to an X-axis direction and a Y-axis direction on an XY plane; a rectangular approximation process for approximating the design pattern to rectangles to generate a rectangular approximation pattern; a first correction process for shifting the side portions of the rectangular approximation pattern in the Y-axis direction to generate a first correction pattern; and a second correction process for enlarging the side portions of the first correction pattern in the X-axis direction and the Y-axis direction to generate an irradiation pattern.

14 Claims, 14 Drawing Sheets

IRRADIATION PATTERN DATA GENERATION METHOD, MASK FABRICATION METHOD, AND PLOTTING SYSTEM

This application is based upon and claims the benefit of priority from Japanese Patent Application No. 2006-274779 filed on Oct. 6, 2006, the content of which is incorporated by reference.

BACKGROUND OF THE INVENTION

1. Field of the Invention

The present invention relates to an irradiation pattern data generation method and plotting system used in irradiating energy upon an object of plotting to carry out plotting, and to a method of fabricating a photomask formed by the plotting system.

2. Description of the Related Art

Techniques are known for using a plotting device to irradiate energy such as an electron beam to form a desired pattern on an object of plotting. Such techniques are applied in, for example, the manufacture of photomasks used in the photolithographic steps in the fabrication process of semiconductors.

A raster scan method and a variable rectangle method are known as methods of such a plotting device. The raster scan method is a plotting method of successively scanning each of the coordinates on a mask by a point beam that has been concentrated to a point. In this raster scan method, a desired pattern is formed on a by turning the beam ON at coordinates for which there are data and turning the beam OFF at coordinates for which there are no data. The advantage of the raster scan method is the ability to estimate the plotting time substantially by the size of the plotting region. All of the coordinates of the plotting region are scanned regardless of the presence or absence of data, and the plotting time therefore depends on the size of the plotting region. However, the difficulty of implementing optical proximity effect correction in the raster scan method necessitates the use of an electron beam of relatively low acceleration voltage (on the order of, for example, 20 keV) that does not exhibit the influence of the proximity effect. Obtaining sufficient resolving power in the raster scan mode is problematic due to the use of an electron beam of relatively low acceleration voltage.

In contrast, the variable rectangle mode is a plotting mode in which the irradiation pattern data are represented by rectangles and these rectangles then exposed one at a time. In a plotting device of the variable rectangle mode, for example, two L-shaped apertures are combined to form a rectangular electron beam of any size. In this method, the acceleration voltage of the electron beam can be made relatively high (on the order of, for example, 50 keV) and a high resolving power can therefore be obtained on the object of plotting. In addition, although the proximity effect cannot be ignored when an electron beam of high acceleration voltage is used, the dimensional accuracy of a micropattern can be increased by correcting the proximity effect by using a function of the area density of a pattern to vary the amount of exposure during plotting.

Of the above-described plotting device modes, the variable rectangle mode, which is advantageous in terms of dimensional accuracy, has currently become the mainstream. When using the variable rectangle method, however, the plotting time can become time-consuming in some cases. This lengthy plotting time occurs because the plotting time increases, not in proportion to the original data (hereinbelow referred to as the "design pattern"), but rather, substantially in proportion to the number of rectangles in the data (hereinbelow referred to as the "irradiation pattern") in which patterns have been divided for plotting. In particular, the inclusion of a pattern that extends diagonally in the design pattern results in division into a multiplicity of extremely minute rectangles in the irradiation pattern, whereby the plotting time becomes extremely long.

A technique that enables a reduction of the plotting time is therefore desired in the variable rectangle method.

The dimensional accuracy during plotting may fall when the form of the rectangles becomes extremely minute. A technique that enables an increase in dimensional accuracy during plotting is therefore also desired.

In relation to the foregoing explanation, JP-A-2000-241958 discloses a photomask provided with a transparent substrate and a shield pattern that indicates a polygonal circuit pattern that includes diagonal lines as polygons in which the diagonal lines are represented as stepped shapes by a plurality of rectangles and in which the width R of the rectangles is in the range $Rw<R<(Rp\times m)$ (where m is the transfer magnification of the exposure device, Rp is the resolving power of the exposure device, and Rw is the resolving power of the mask plotting device).

However, a dimensional shift (hereinbelow referred to as "process bias") may occur between the pattern of the electron beam that is irradiated upon the object of plotting and the pattern that is actually formed on the object of plotting. This dimensional shift depends on such factors as the electron beam resist material that is formed on the object of plotting, the etching equipment, the fabrication process of the material and film thickness of the object of plotting, the dimensions of the pattern, and the spacing between adjacent patterns. Thus, to form a pattern of desired dimensions on an object of plotting, the electron beam must be irradiated by a correction pattern in which correction has been carried out based on the amount of change, which is the process bias. This type of correction is carried out by, for example, a rule-based method (a method in which pattern dimensions and a table or a function of the amount of correction from adjacent patterns are first generated and correction then carried out by successively applying the pattern to this table or function).

In relation to the foregoing explanation, the publication JP-A-2003-273001 discloses a data generation method for plotting a mask pattern by means of an electron beam. In this data generation method, a bias process for dimensional correction is applied to pattern data of a semiconductor integrated circuit that has been subjected to design layout, wherein correction is applied to pattern data that have been divided into rectangles and/or trapezoids without alteration and without subjecting pattern data that have been divided into rectangles and/or trapezoids to an outline process.

When carrying out the above-described correction of process bias in portions corresponding to diagonal patterns of a design pattern in the above-described plotting device of the variable rectangle method, the number of rectangles may undergo a further dramatic increase. The reasons for this increase are next explained with reference to FIGS. 1A-1C.

FIG. 1A shows a rectangular approximation pattern in which the diagonal pattern portion of a design pattern is approximated by rectangular shapes for the variable rectangle method. FIG. 1A shows a rectangular approximation pattern made up from four rectangles. Each rectangle is formed from parallel sides in the X-axis direction and parallel sides in the Y-axis direction. The side portions of the design pattern are represented by a stepped shape by this plurality of rectangles.

FIG. 1B is a view for explaining the implementation of the process bias correction of the rectangular approximation pattern. In FIG. 1B, a "+(plus)" value process bias is conferred to the rectangular approximation pattern, and the dimensions of the rectangular approximation pattern shows a state that is enlarged to the extent of this process bias from the dimensions of the design pattern. In this pattern that results from correction, the Y-coordinates of the apices that form the stepped shapes on the two side portions of the design pattern do not coincide. As a result, the pattern that follows correction cannot be represented by just four rectangles as in the rectangular approximation pattern. Accordingly, to represent the pattern following correction, a greater number of rectangles are necessary. In other words, the implementation of the process bias correction causes the number of rectangles that form the irradiation pattern to surpass the number of rectangles that form the rectangular approximation pattern. The increase in the number of rectangles leads to an increase in the plotting time.

FIG. 1C shows the representation of the pattern following correction by rectangles. When actually plotting, electron beam irradiation is carried out for each of the rectangles r1, r2, and r3 shown in FIG. 1C. Here, when the process bias $\Delta$ is a "+" value, i.e., when the dimensions of the rectangular approximation pattern are made greater by the process bias $\Delta$ than the dimensions of the design pattern, long and narrow rectangles r2 that form regions that include the sides in the X-axis direction of the rectangular approximation pattern have a width in the Y-axis direction that is just twice the length of the process bias. In other words, rectangles r2 are minute rectangles. Irradiating an electron beam in such minute rectangles r2 is disadvantageous from the standpoint of dimensional accuracy.

It is therefore an object of the present invention to provide a irradiation pattern data generation method, a mask fabrication method, and a plotting system that enable a reduction of the plotting time.

It is another object of the present invention to provide an irradiation pattern data generation method, a mask fabrication method, and a plotting system that do not cause an increase in the number of rectangles when implementing process bias correction.

It is yet another object of the present invention to provide an irradiation pattern data generation method, a mask fabrication method, and a plotting system that limit the miniaturization of rectangles.

SUMMARY OF THE INVENTION

The means for solving the problem are represented as shown below. Numbers and symbols in parentheses ( ) have been added to the technical features shown in the following representation. These numbers and symbols match the reference numbers and reference symbols added to technical features that make up at least one embodiment among a plurality of embodiments, and in particular, technical features represented in the drawings that correspond to the embodiments. These reference numbers and reference symbols clarify the correspondence and intermediation between technical features described in the claims and technical features of each embodiment. This correspondence and intermediation do not mean that the technical features described in the claims are to be interpreted as limited to the technical features of the embodiments.

The irradiation pattern data generation method according to the present invention is an irradiation pattern data generation method for generating irradiation pattern data when plotting an object of plotting (40) by energy irradiation by means of the variable rectangle mode. This irradiation pattern data generation method includes: a process (Step S10) for providing a design pattern (1) having diagonal side portions (3); a rectangular approximation process (Step S30) for generating a rectangular approximation pattern (4) in which the design pattern (1) is approximated as rectangles; a first correction process (Steps S40-S50) for moving the side portions of the rectangular approximation pattern (4) in the Y-axis direction to generate a first correction pattern (8); and a second correction process (Step S60) for expanding the side portions of the first correction pattern (8) in the X-axis direction and the Y-axis direction to generate an irradiation pattern (12).

In addition, in the first correction process (S40-S50), the side portions of the rectangular approximation pattern are moved by a process bias $\Delta$ that is equal to the amount of reduction that a formation pattern actually formed on an object of plotting is reduced from the irradiation pattern (12). In the second correction process (S60), the side portions of the first correction pattern are expanded by the process bias $\Delta$ in the X-axis direction and the Y-axis direction.

The first correction process (S40-S50) includes a Y-axis direction correction process (S40) for shifting the side portions of the rectangular approximation pattern (4) by the process bias $\Delta$ in the Y-axis direction to generate a Y-axis direction correction pattern (6). When generating the Y-axis direction correction pattern (6) in the Y-axis direction correction process (S40), the positions of the side portions (5) of the rectangular approximation pattern (4) are shifted by a prescribed shift amount that corresponds to the process bias $\Delta$ in the Y-axis direction.

Implementing the first correction process (S40-S50) before the second correction step (S60) as described above can offset the shift in the coordinates of the apices in rectangles that occurs during the expansion process by the amount of process bias $\Delta$ in the second correction process. Taking advantage of this offset of the shift eliminates the need to increase the number of rectangles in the irradiation pattern (12) and thus avoids increase in the plotting time.

In the above-described irradiation pattern data generation method, diagonal side portions (3) of the design pattern (1) extend diagonally with respect to the X-axis direction and the Y-axis direction in the XY plane, and when approximating the design pattern (1) in the rectangular approximation process (S30), approximation is preferably implemented such that each of the rectangles that make up the rectangular approximation pattern are formed by sides that are parallel to the X-axis direction and Y-axis direction and the length in the X-axis direction of each of these rectangles equals the dimension parallel to the X-axis direction (hereinbelow referred to as the "X-axis direction width") between diagonal side portions in the design pattern (1); and in the Y-axis direction correction process (S40), the side portions (5) of the rectangular approximation pattern (4) are preferably shifted by process bias $\Delta$, which is a prescribed shift amount $\Delta$ in the direction parallel to the Y-axis direction, and moreover, in the direction into the rectangular approximation pattern (4).

In this irradiation pattern data generation method, the first correction process (S40-S50) preferably includes an X-axis direction correction process (S50) that is carried out after the Y-axis direction correction process (S40). At this time, the side portions (7) of the Y-axis direction correction pattern (6) are shifted in a direction parallel to the X-axis direction, and moreover, away from the Y-axis direction correction pattern (6) in the X-axis direction correction process (S50).

In the rectangular approximation process (S30), a rectangular approximation pattern is preferably generated such that adjacent rectangles share at least one portion of sides that extend in the X-axis direction.

In the above-described irradiation pattern data generation method, the rectangular approximation process (S30), the first correction process (S40-S50), and the second correction process (S60) are preferably executed by a computer.

In the rectangular approximation process (S20) of the above-described irradiation pattern data generation method, approximation is preferably carried out such that adjacent rectangles overlap at at least one portion of sides that extend in the X-axis direction.

The irradiation pattern data generation method in another mode of the present invention is an irradiation pattern data generation method for generating irradiation pattern data when plotting on an object of plotting (40) by energy irradiation according to the variable rectangle mode. This irradiation pattern data generation method includes: a process (Step S110) of providing a design pattern (1) having diagonal side portions (3) that extend diagonally with respect to the X-axis direction and the Y-axis direction on the XY plane; a rectangular approximation process (S130) of approximating the design pattern (1) as at least one rectangle to generate a rectangular approximation pattern (13); and a bias correction process (S140) of expanding the rectangular approximation pattern (13) by the process bias Δ to generate an irradiation pattern (15). Here, the process bias Δ is the amount of reduction of a formation pattern (41) that is actually formed on an object of plotting (40) with respect to the irradiation pattern (15). In addition, in the rectangular approximation process (S120), approximation is carried out such that each of the rectangles that make up the rectangular approximation pattern is formed by sides that are parallel to the X-axis direction and the Y-axis direction and is formed such that the length in the X-axis direction of each of the rectangles equals the width in the X-axis direction of the design pattern (1) and adjacent rectangles overlap at at least one portion of the side (width) that extends in the X-axis direction.

According to the above-described method, adjacent rectangles in the rectangular approximation pattern are formed such that at least a portion of sides that extend in the X-axis direction overlap, whereby the width of the rectangles in the X-axis direction can be widened by the amount of the overlap when the bias correction pattern is divided into a plurality of rectangles. The width in the X-axis direction of each rectangle in the irradiation pattern expands, whereby minute rectangles are not produced and the dimensional accuracy is not degraded.

The irradiation pattern data generation program (30 and 50) according to the present invention is a program for causing the above-described irradiation pattern data generation method to be executed by a computer.

The photomask fabrication method according to the present invention includes: a first process (Steps S80 and S150) for irradiating energy on an object of plotting (40) based on irradiation pattern data that have been generated by the above-described irradiation pattern data generation method; and a second process (Step S75) for irradiating energy on a photomask using the irradiation pattern (15) formed by the first process.

The plotting system (20) according to the present invention is provided with: a plotting device (21) for irradiating energy onto an object of plotting (40) by a variable rectangle mode; and a control device (22) for controlling the operation of the plotting device (21). The control device (22) is provided with: a rectangular approximation processor (32) for, upon the input of a design pattern (1) having a diagonal side portions (3) that extend diagonally with respect to the X-axis direction and the Y-axis direction in the XY plane, approximating the design pattern (1) by rectangles to form a rectangular approximation pattern (4); a first correction processor (33) for, based on the rectangular approximation pattern (4), generating a first correction pattern (8); and a second correction processor (10) for expanding the first correction pattern (8) by a process bias Δ to generate irradiation pattern data. Here, the process bias Δ is the amount of reduction of a formation pattern (41) that is actually formed on an object of plotting (40) with respect to the irradiation pattern (15). The first correction processor (33) includes a Δ shift unit (36). A Y-axis direction correction processor (36) shifts the side portions (5) of the rectangular approximation pattern exactly the process bias Δ to generate a Y-axis direction correction pattern (6). A plotting device (21) irradiates energy onto the object of plotting (40) based on the irradiation pattern data that have been generated by the control device (22).

Another mode of the plotting system according to the present invention is provided with: a plotting device (21) for irradiating energy onto an object of plotting (40) by the variable rectangle mode; and a control device for controlling the operation of the plotting device (21). This control device includes: a rectangular approximation processor (52) for, upon provision of a design pattern (1) having diagonal portions (3) that have width and that extend diagonally with respect to the X-axis direction and the Y-axis direction on the XY plane, causing the diagonal portions (3) to approximate rectangles to form a rectangular approximation pattern (13); and a bias correction processor (53) for expanding the rectangular approximation pattern (13) by a process bias Δ to generate an irradiation pattern (15). Here, the process bias Δ is the amount of reduction of a formation pattern (41) that is actually formed on an object of plotting (40) with respect to the irradiation pattern (15). In the rectangular approximation processor (52), each of the rectangles that make up the rectangular approximation pattern is formed by sides that are parallel to the X-axis direction and the Y-axis direction, is approximated such that the length of the rectangles in the X-axis direction equals the width of the design pattern (1) in the X-axis direction, and is approximated such that adjacent rectangles overlap at at least a portion of sides that extend in the X-axis direction. Plotting device (21) irradiates energy upon the object of plotting (40) in the irradiation pattern (15) that has been generated by the control device.

In the above-described plotting system, plotting device (21) is preferably an electron beam irradiation device.

The present invention provides an irradiation pattern data generation method, a mask fabrication method, and a plotting system that can reduce the plotting time.

The present invention further provides an irradiation pattern data generation method, mask fabrication method, and plotting system that do not increase the number of rectangles when carrying out process bias correction.

DETAILED DESCRIPTION OF THE PREFERRED EMBODIMENTS

First Embodiment

Explanation next regards the first embodiment with reference to the accompanying drawings.

Figure 1A:
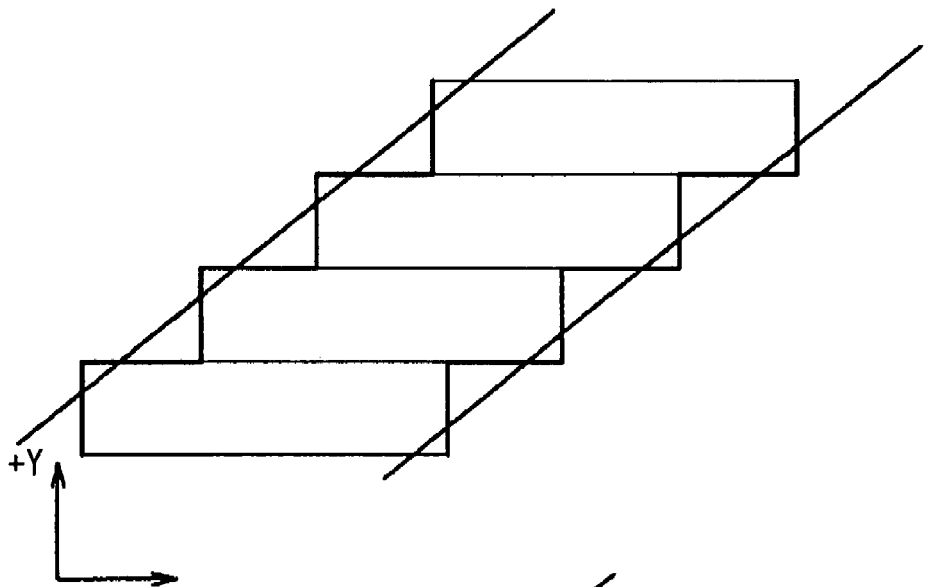
FIGS. 1A, 1B, and 1C are views for explaining the irradiation pattern data generation method of the related art.
Figure 1B:
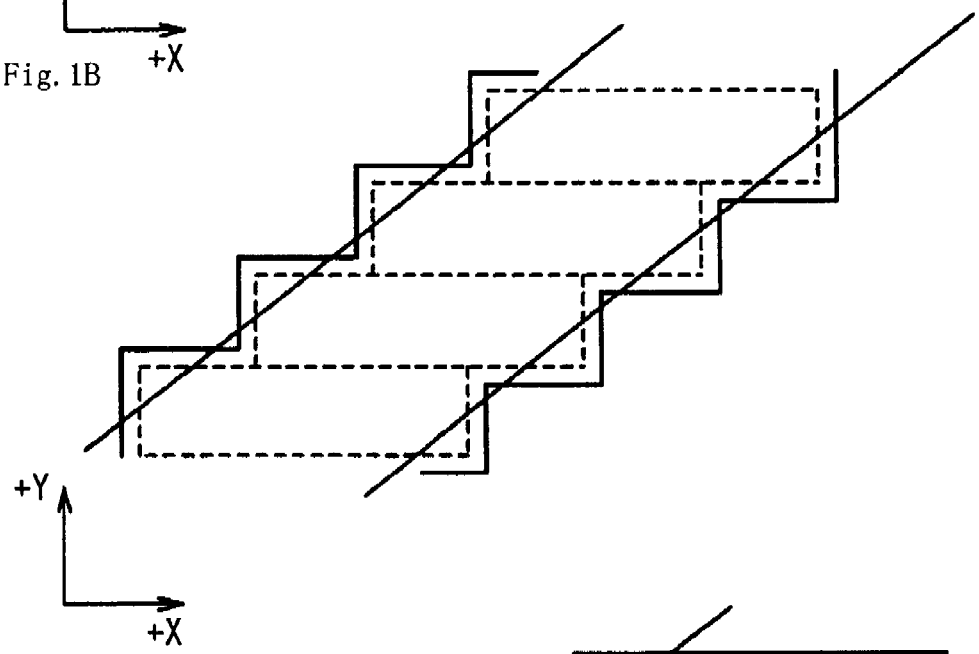
Figure 1C:
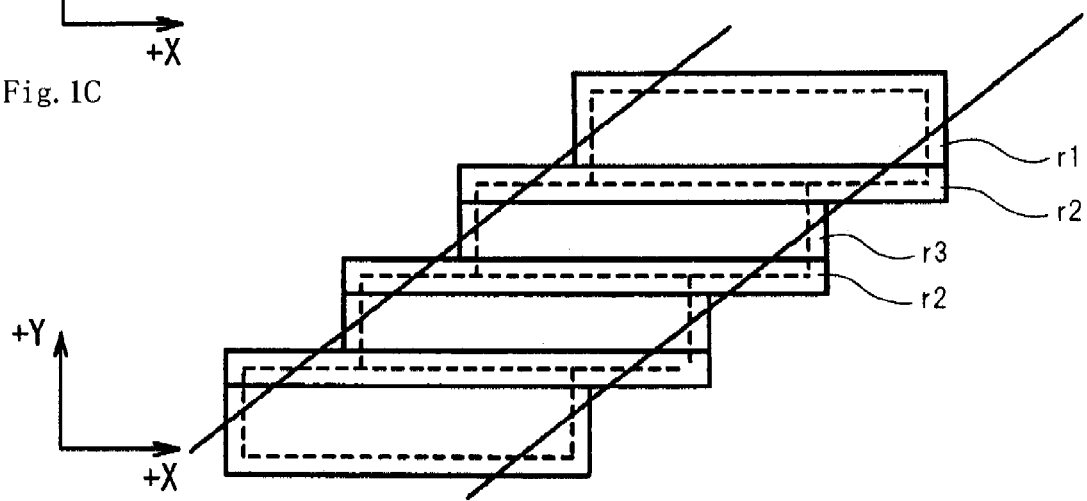
Figure 2:
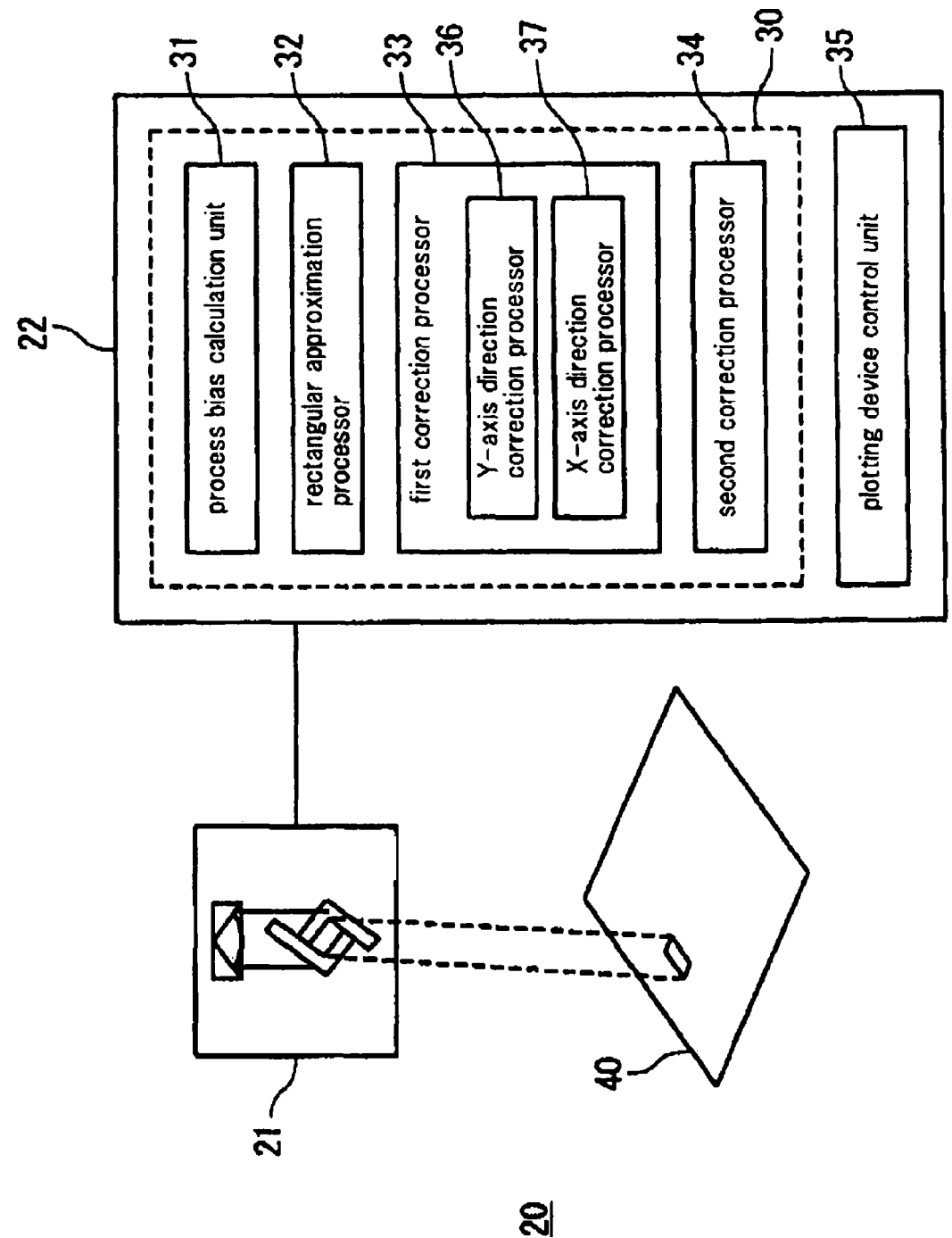
FIG. 2 is a schematic view of the configuration of the plotting system of the first embodiment.

FIG. 2 is a schematic view of the configuration of plotting system 20 of the present embodiment. As shown in FIG. 2, plotting system 20 includes plotting device 21 and control device 22. Plotting device 21 is a device for irradiating an electron beam upon object of plotting 40 to carry out plotting. Control device 22 generates the pattern (irradiation pattern) of the beam that is irradiated by plotting device 21 and controls the operation of plotting device 21. In addition, the generation of the irradiation pattern and the control of the operation of plotting device 21 need not be carried out in a single device, but may be implemented by separate devices.

By way of example, control device 22 is shown as a computer that includes RAM (Random Access Memory) and ROM (Read Only Memory), a CPU, and a hard disk. Irradiation pattern generation program 30 and plotting device control unit 35 are stored as computer programs in control device 22. Irradiation pattern generation program 30 is a program for realizing the function of generating an irradiation pattern. Irradiation pattern generation program 30 includes process bias calculation unit 31, rectangular approximation processor 32, first correction processor 33, and second correction processor 34. First correction processor 33 includes Y-axis direction correction processor 36 and X-axis direction correction processor 37. However, details regarding the function of irradiation pattern generation program 30 will be described later. Plotting device control unit 35 realizes the function of controlling the operation of plotting device 21.

Plotting device 21 includes an electron beam generation device for generating an electron beam and two L-shaped apertures. The electron beam generated by the electron beam generation device is formed by the L-shaped apertures such that its section is rectangular. The electron beam that has been made rectangular is then irradiated unto object of plotting 40. In other words, plotting device 21 is variable rectangle method electron beam irradiation device.

Photomask 40 can be offered as an example of object of plotting 40. In the present embodiment, explanation regards a case in which object of plotting 40 is photomask 40 for forming a wiring pattern such as for a DRAM (Dynamic Random Access Memory) on a semiconductor wafer. A wiring pattern of a device such as a DRAM includes many patterns that extend diagonally, and the number of rectangles that make up an irradiation pattern used when forming a photomask can easily increase. A means of suppressing the increase in the number of rectangles in an irradiation pattern is therefore more desirable.

A brief explanation is next presented regarding the process of fabricating a photomask. A resist is first formed on a glass substrate on which a light-shielding film composed of, for example, chromium is formed. An electron beam is next irradiated onto prescribed regions of the resist based on irradiation pattern data. A resist development process is next carried out to remove resist of regions not irradiated by the electron beam, and an irradiation pattern composed of resist is formed in regions irradiated by the electron beam. The light-shielding film is then etched using the resist formed by the irradiation pattern as a mask. A method such as a dry etching method that uses, for example, a chloride gas plasma is used in this etching of the light-shielding film. After this etching, the resist that was used as a mask is removed, whereby a photomask pattern composed of the light-shielding film is formed on the glass substrate.

Here, when transferring the irradiation pattern composed of a resist onto the photomask pattern that is made up from the light-shielding film, a dimensional offset in which the dimensions are altered occurs between these patterns. In the present invention, the amount of this dimensional offset is referred to as process bias $\Delta$. In other words, process bias $\Delta$ in the present invention means the amount of change between the dimensions of the irradiation pattern transferred to the photomask and the dimensions of the photomask pattern that is actually formed on photomask 40.

Process bias $\Delta$ depends on the etching device and the various conditions of the photolithography process such as film thickness and the material of the mask light-shielding film. As a result, the photomask pattern that is formed may be enlarged with respect to the irradiation pattern that is actually irradiated. In the present embodiment, process bias $\Delta$ is defined as the amount of change by which the photomask pattern that is actually formed on photomask 40 is reduced from the irradiation pattern that is actually irradiated. This process bias $\Delta$ is determined based on, for example, the various conditions in the photolithography process.

The photomask on which a photomask pattern has been formed is installed in an exposure device and a semiconductor wafer on which a photoresist is formed is subjected to an exposure process and a development process, whereby the photomask pattern of the photomask is transferred to the photoresist on the semiconductor wafer.

Figure 3:
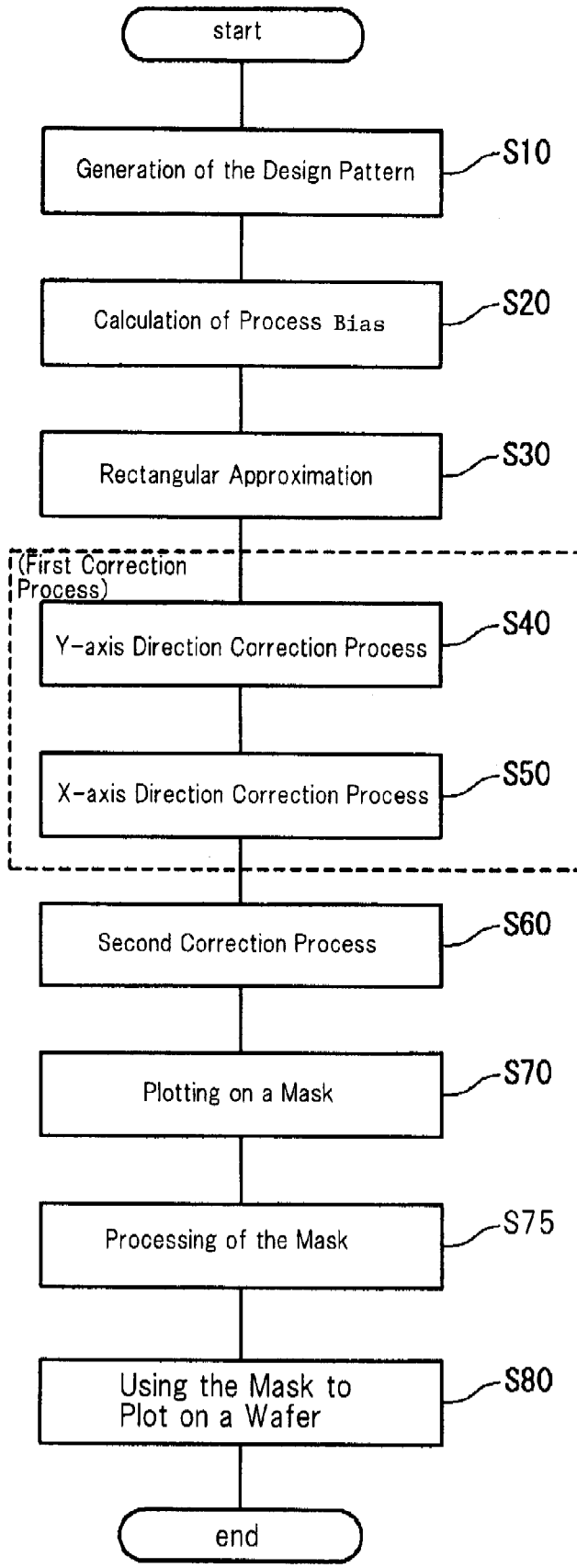
FIG. 3 is a flow chart of the irradiation pattern data generation method of the first embodiment.

Explanation next regards the irradiation pattern data generation method according to the present embodiment. FIG. 3 is a flow chart of the semiconductor wafer plotting method that includes this irradiation pattern data generation method. Irradiation pattern data are generated by the process of Steps S10-S60 shown in FIG. 3. An irradiation pattern is formed on the resist based on the irradiation pattern data in the process of Step S70. This irradiation pattern is used to form a photomask pattern on photomask 40 in the process of Step S75. Finally, a pattern is formed in the photoresist on the wafer in the process of Step S80. The details of each process are explained hereinbelow.

Step S10: Generation of the Design Pattern

Figure 4:
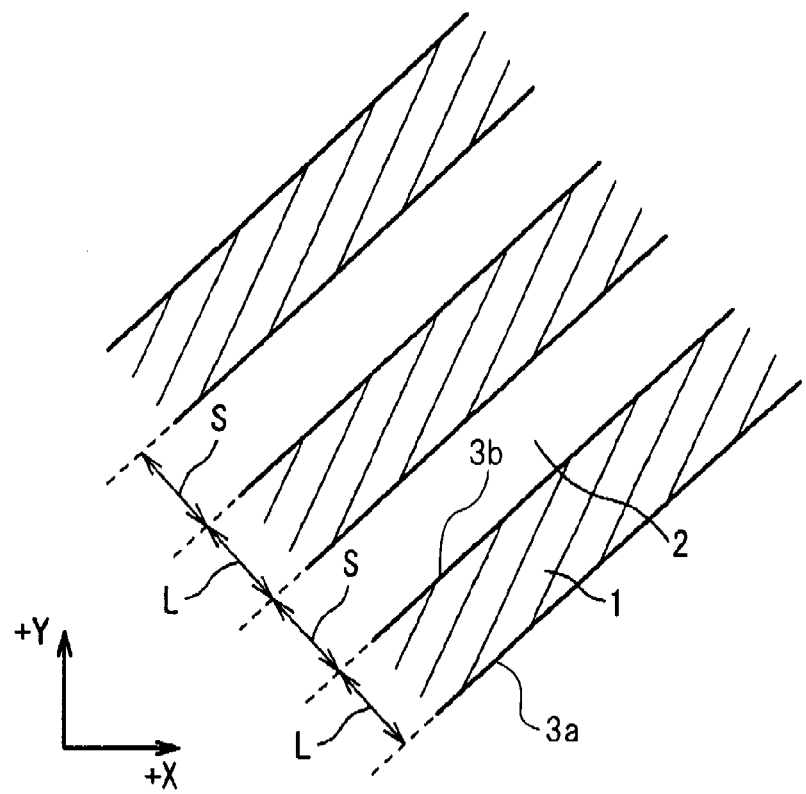
FIG. 4 is a view for explaining the design pattern in the first embodiment.

Design pattern 1, which is a desired pattern that is actually to be formed on a wafer, is first prepared as data. FIG. 4 is a view for explaining design pattern 1. In the present embodiment, design pattern 1 is "line 1 and space 2=width is L[nm]/S[nm]" and this will be explained as a pattern that extends in a 45° angle direction with respect to the X-axis direction and Y-axis direction in the XY plane. Design pattern 1 includes diagonal side portions 3a and 3b, and the two side portions in one design pattern 1 are diagonal side portions (3a, 3b).

The region irradiated by electron beam on photomask 40 is determined as corresponding to a line (pattern) portion or corresponding to a space portion by the types (negative and positive) of resist formed on the wafer and photomask 40. In the present embodiment, explanation regards a case in which the region irradiated by the electron beam corresponds to the pattern portion.

When the pattern is formed on a wafer, the photomask pattern on the photomask is in some cases reduced when transferred. In such cases, the dimensions of the irradiation pattern for forming the photomask pattern are dimensions in which the pattern on the wafer has been enlarged (for example, four times). In the following explanation, however, for the sake of convenience, the size of each pattern is adjusted to the size of the pattern on the wafer.

Design pattern 1 that has been prepared as previously described is read to control device 22.

Step S20: Calculation of Process Bias Δ

The above-described process bias Δ is next calculated by process bias calculation unit 31.

Step S30: Rectangular Approximation

Figure 5:
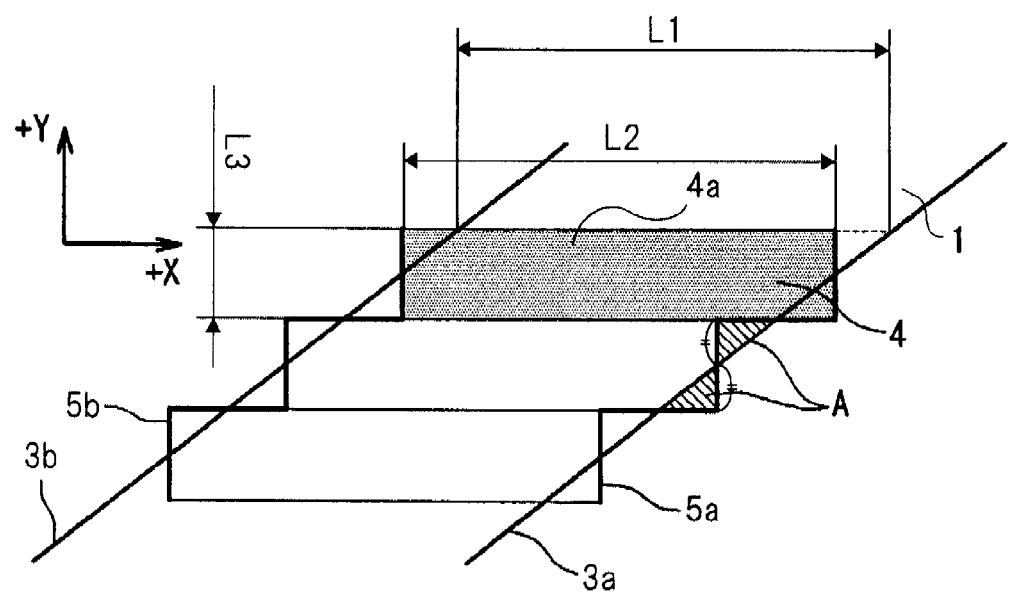
FIG. 5 is a view for explaining the rectangular approximation pattern in the first embodiment.

Rectangular approximation processor 32 next performs rectangular approximation of design pattern 1 to generate rectangular approximation pattern 4 composed of at least one rectangle. FIG. 5 is a view for explaining the rectangular approximation. For the sake of convenience, FIG. 5 shows only one line of design pattern 1. As shown in FIG. 5, each rectangle that makes up rectangular approximation pattern 4 is formed from two opposing sides parallel to the X-axis direction and two opposing sides parallel to the Y-axis direction. Diagonal side portion 3a of design pattern 1 is represented as stepped side portion 5a (side portion 5a of rectangular approximation pattern 4) in rectangular approximation pattern 4. Similarly, diagonal side portion 3b is represented as side portion 5b of rectangular approximation pattern 4.

In addition, the length in the X-axis direction of each rectangle is made equal to the dimension that is parallel to the X-axis direction between the diagonal side portions 3a and 3b (the width in the X-axis direction) of design pattern 1. The rectangles are each formed by arranging such that each rectangle shares at least a portion of sides that extend in the X-axis direction with neighboring rectangles. In addition, each rectangle is formed such that the middle points of sides that extend in the Y-axis direction are arranged on design pattern 1. However, when diagonal side portion 3 is not a straight line, the rectangles may be formed such that the plurality of regions A formed by side portions 5 of rectangular approximation pattern 4 and diagonal side portion 3 as shown in FIG. 5 have equal area. The length of sides in the Y-axis direction of each rectangle is a length no greater than resolving power R (=k1×λNA) when forming a pattern on photomask 40. The value k1 is a coefficient determined by processes such as the resist properties, λ is the wavelength of the electron beam, and NA is the numerical aperture. Rectangular approximation is carried out at a width no greater than resolving power R to form a line that extends diagonally on the wafer even when side portions 5 of rectangular approximation pattern 4 produce a stepped shape on photomask 40.

Step S40: First Correction Process (Y-axis Direction Correction Process)

Figure 6:
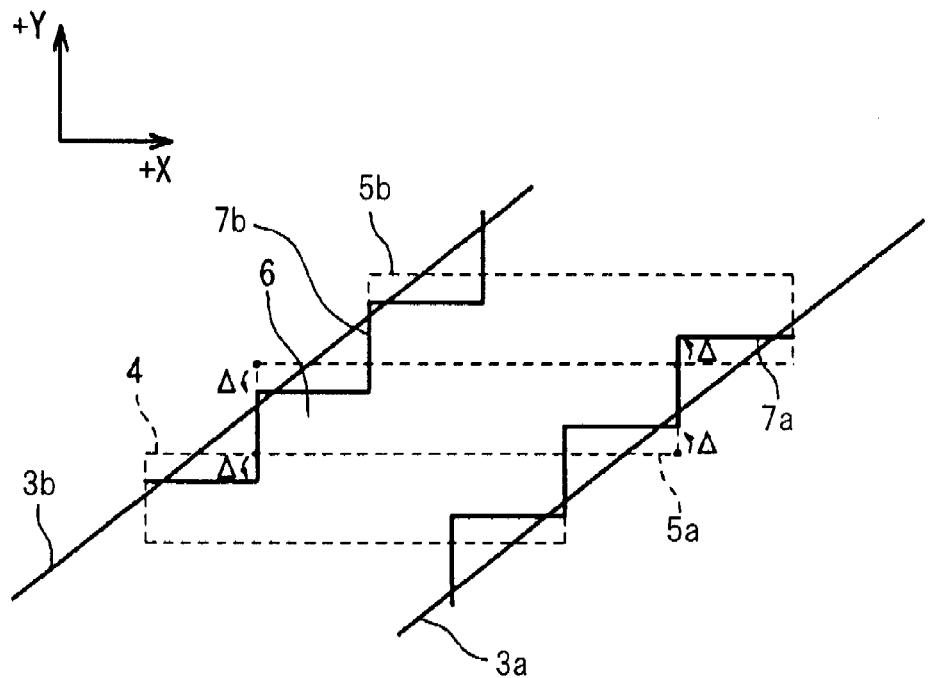
FIG. 6 is a view for explaining the Y-axis direction correction pattern in the first embodiment.

Y-axis direction correction processor 36 next generates Y-axis direction correction pattern 6 based on rectangular approximation pattern 4. FIG. 6 is a view for explaining the Y-axis direction correction process. Y-axis direction correction processor 36 shifts each of the stepped side portions 5a and 5b of rectangular approximation pattern 4 in the direction parallel to the Y-axis direction and moreover, toward the interior of rectangular approximation pattern 4. In other words, Y-axis direction correction processor 36 shifts each apex located on the outside in side portions 5a and 5b that form the stepped shape of rectangular approximation pattern 4 by a shift amount Δ in the Y-axis direction to approach diagonal side portions 3a and 3b of design pattern 1, as shown in FIG. 6. In other words, side portion 5a of rectangular approximation pattern 4 is shifted in the "+"Y direction along the Y-axis direction, and side portion 5b of rectangular approximation pattern 4 is shifted in the "−"Y direction along the Y-axis direction. By this type of correction, side portion 5a of rectangular approximation pattern 4 becomes side portion 7a of Y-axis direction correction pattern 6, and side portion 5b of rectangular approximation pattern 4 becomes side portion 7b of Y-axis direction correction pattern 6. The amount of shift in the Y-axis direction at this time is made equal to the above-described process bias Δ.

Step S50: First Correction Process (X-axis Direction Correction Process)

Figure 7:
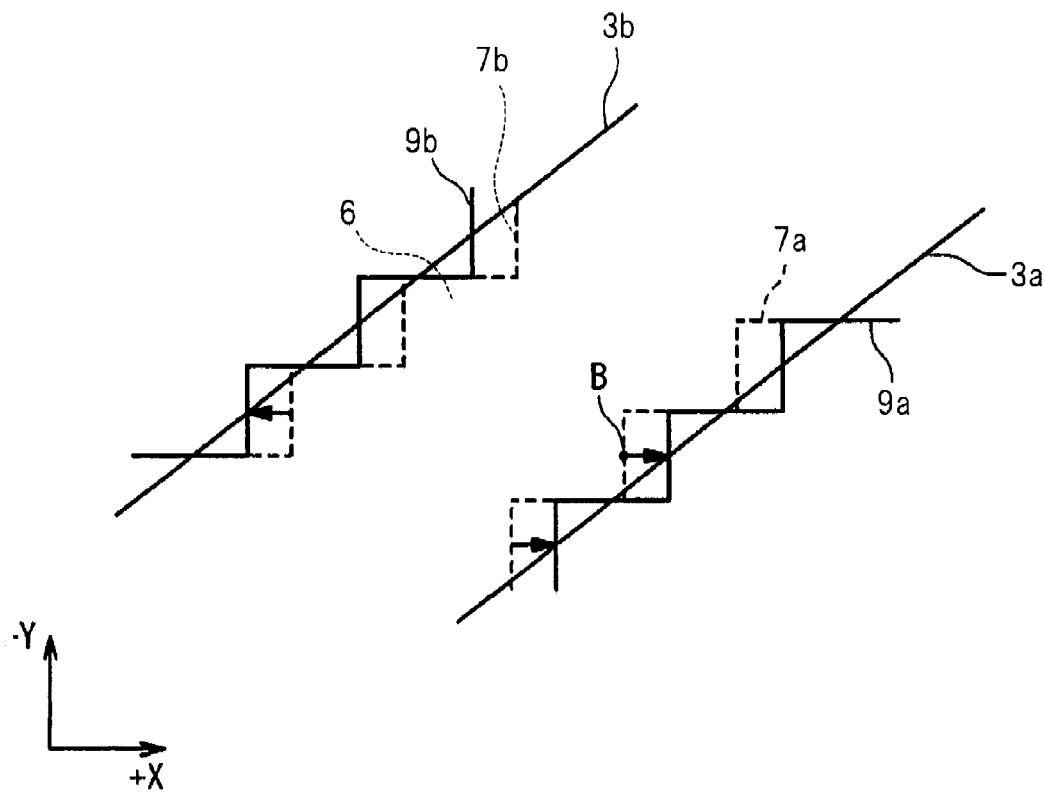
FIG. 7 is a view for explaining the first correction pattern in the first embodiment.

X-axis direction correction processor 37 next generates first correction pattern 8 based on Y-axis direction correction pattern 6. FIG. 7 is a view for explaining the X-axis direction correction process. X-axis direction correction processor 37 shifts side portions 7a and 7b of Y-axis direction correction pattern 6 in a direction parallel to the X-axis direction, and moreover, a direction away from Y-axis direction correction pattern 6. In other words, X-axis direction correction processor 37 enlarges such that each apex located on the outside in side portions 7a and 7b that form the stepped shape of Y-axis direction correction pattern 6 as shown in FIG. 7 protrudes toward the outside from diagonal side portions 3a and 3b of design pattern 1. In other words, side portion 7a of Y-axis direction correction pattern 6 is shifted toward "+" X along the X-axis direction to become side portion 9a of first correction pattern 8, and side portion 7b of Y-axis direction correction pattern 6 is shifted toward "−" X along the X-axis direction to become side portion 9b of first correction pattern 8. In addition, the amount of shift in the Y-axis direction correction process is an amount such that middle points B on sides parallel to the Y-axis direction in the stepped portion of side portion 7a of Y-axis direction correction pattern 6 are positioned on diagonal side portion 3a of design pattern 1.

Step S60: Second Correction Process

Figure 8:
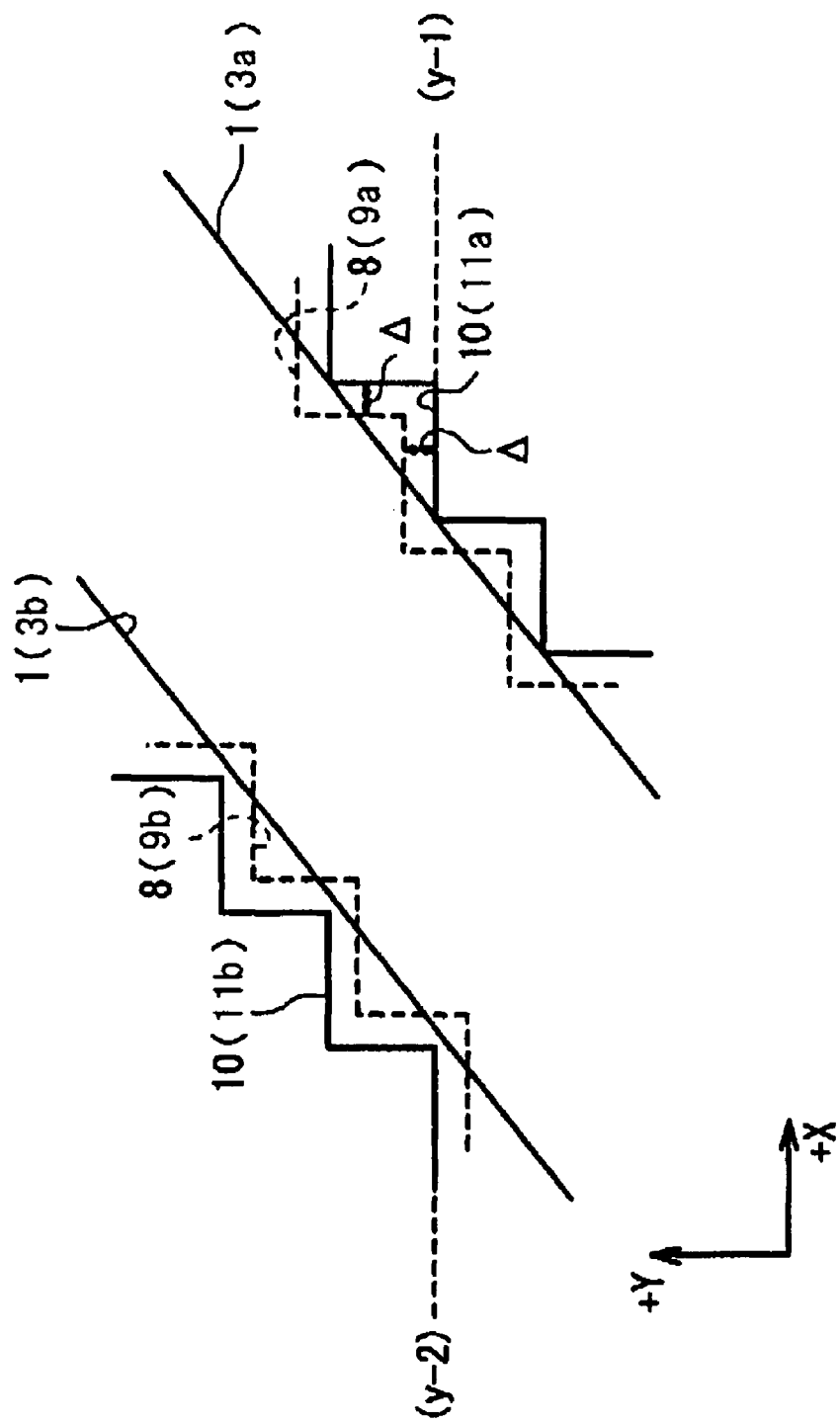
FIG. 8 is a view for explaining the second correction pattern in the first embodiment.

Next, as shown in FIG. 8, second correction processor 34 further expands each of the side portions 9a and 9b of first correction pattern 8 by the process bias Δ toward the X-axis direction and the Y-axis direction to generate second correction pattern 10. Accordingly, side portion 9a of first correction pattern 8 becomes side portion 11a of second correction pattern 10, and side portion 9b of first correction pattern 8 becomes side portion 11b of second correction pattern 10. At this time, the Y coordinates (y-1) of sides that extend in the X-axis direction in side portion 11 of second correction pattern 10 coincide with Y coordinates (y-2) of sides that extend in the X-axis direction in side portion 11b of second correction pattern 10. This matching occurs because the Δ-portion shift produced in the Y-axis direction correction process as shown in FIG. 6 is offset by the second correction process. The Y coordinates of sides that extend in the X-axis direction of the side portions (11a and 11b) of second correction pattern 10 each match, and second correction pattern 10 can therefore be formed by the same number of rectangles as the number of rectangles that make up rectangular approximation pattern 4. Second correction processor 34 divides second correction pattern 10 into a plurality of rectangles and takes these rectangles as irradiation pattern data.

Step S70: Plotting on a Mask

Figure 9:
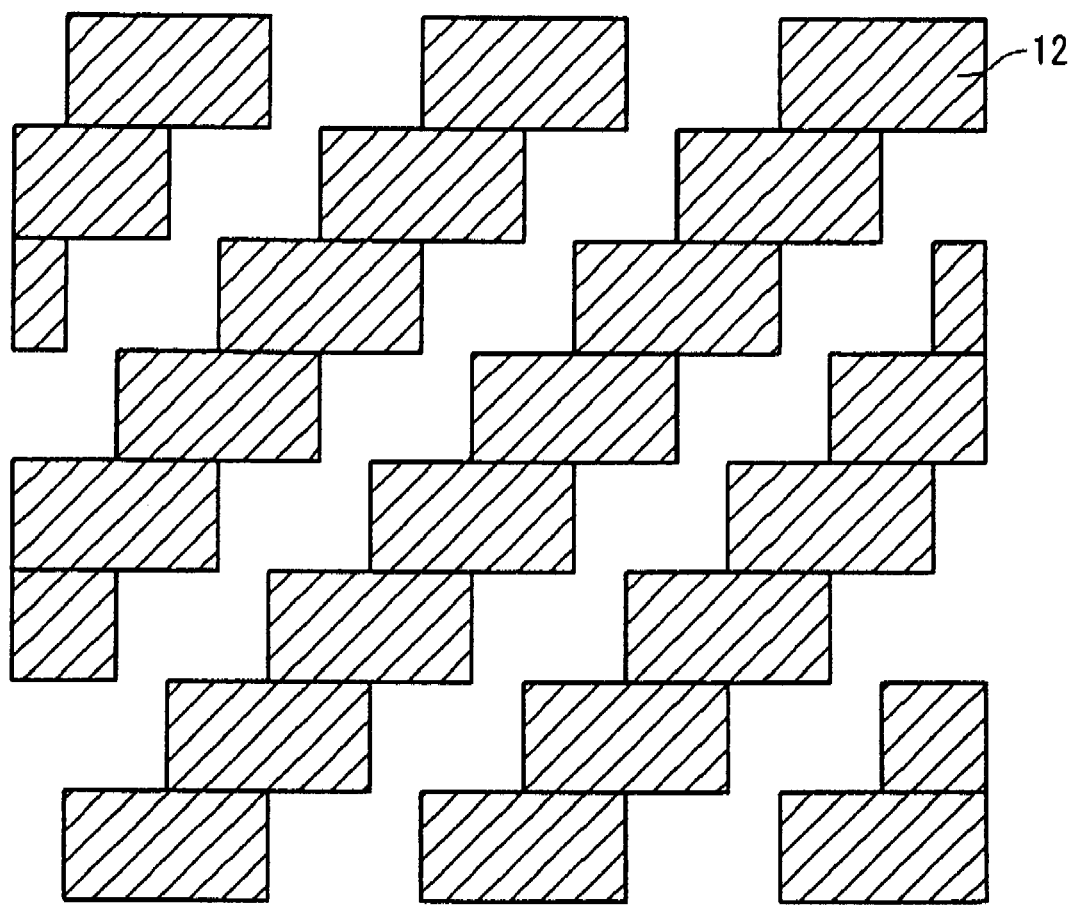
FIG. 9 is a view for explaining the irradiation pattern data in the first embodiment.

Plotting device control unit 35 next controls the drive of plotting device 21 to irradiate an electron beam upon the resist based on the irradiation pattern data. Irradiation pattern 12 is then formed in the resist by a development process. FIG. 9 shows irradiation pattern 12 that is irradiated on the resist. The electron beam is irradiated in rectangle units in irradiation pattern 12. In this case, irradiation pattern 12 is represented by the same number of rectangles as rectangular approximation pattern 4, and there is consequently no prolongation of plotting time.

Step S75: Processing of the Mask

Figure 10:
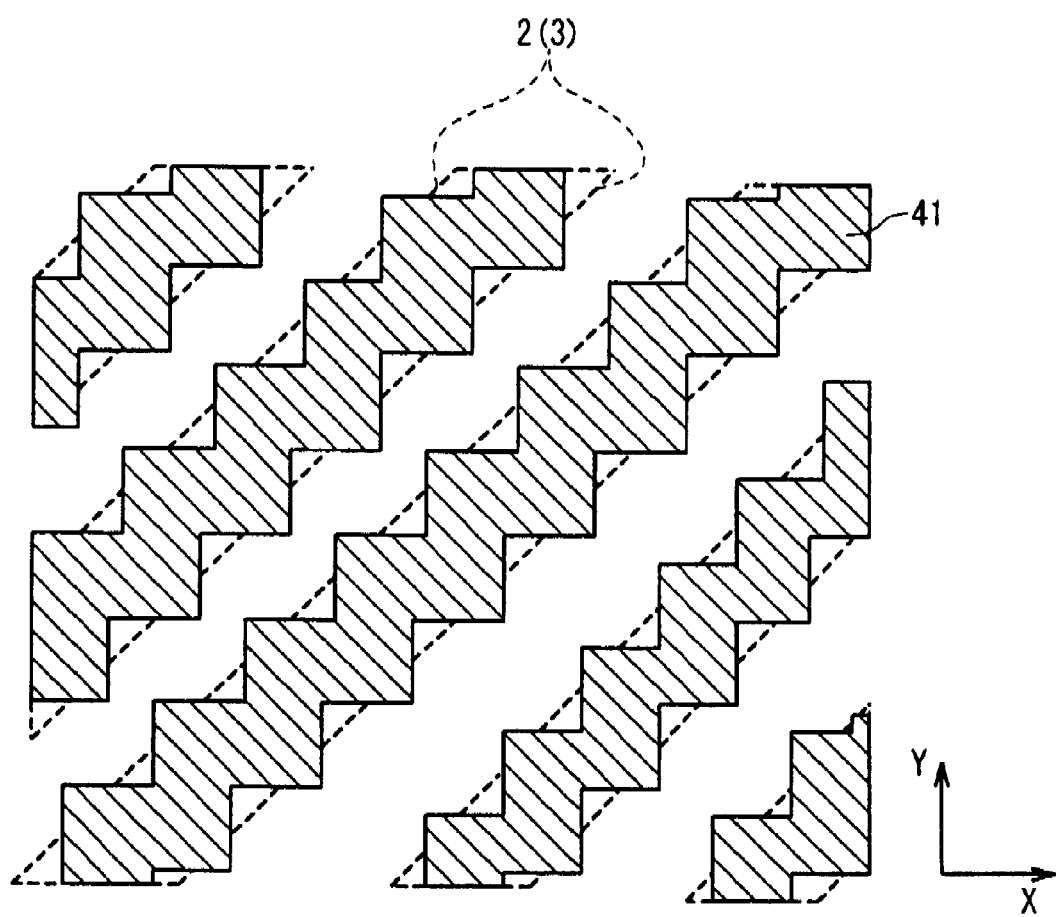
FIG. 10 is a view for explaining the pattern on the photomask in the first embodiment.

The resist in which irradiation pattern 12 has been formed is next used to form photomask pattern 41 on photomask 40 that is composed of a light-shielding film by etching the light-shielding film. FIG. 10 shows photomask pattern 41 that has been formed on photomask 40 using irradiation pattern 12. Photomask pattern 41 that is actually formed on photomask 40 is reduced by the process bias Δ compared to the size of irradiation pattern 12. In other words, a pattern is formed that is the same size as the pattern before correction was carried out by the second correction process (first correction pattern 8).

Step S80: Using the Mask to Plot on a Wafer

Figure 11:
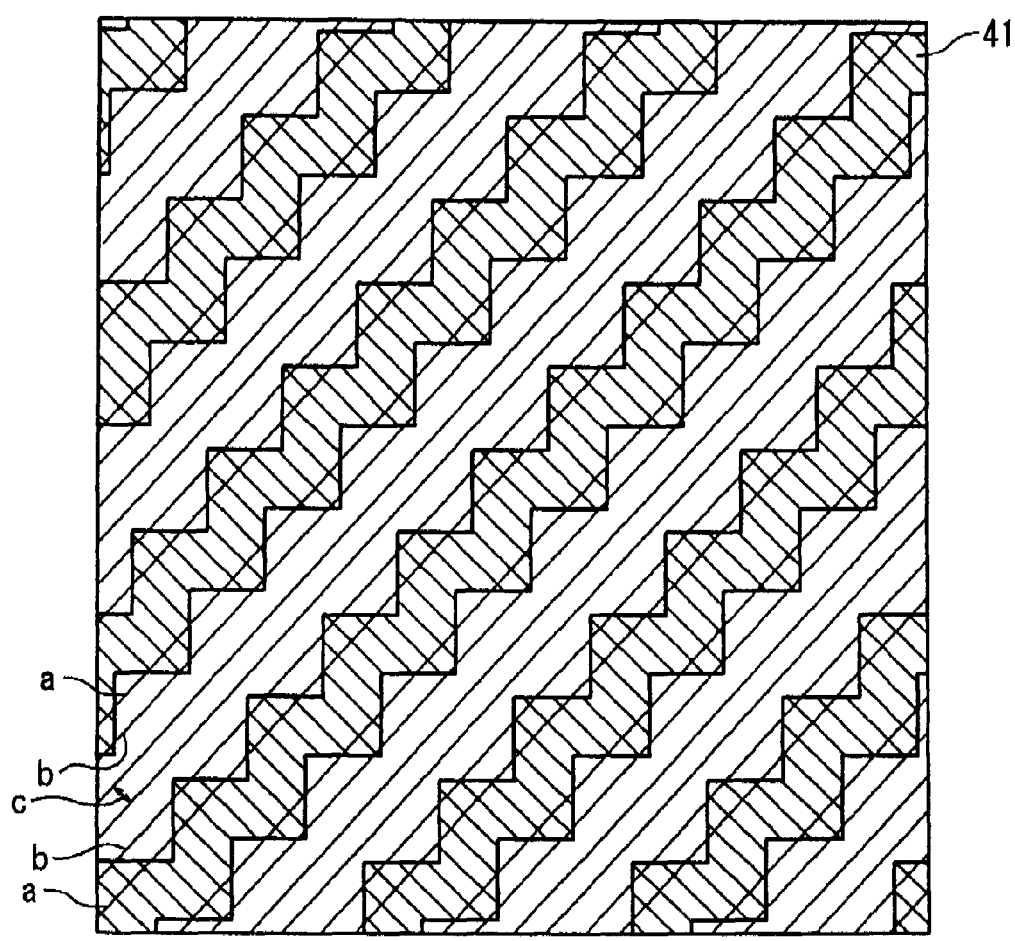
FIG. 11 is a view for explaining the simulation results of the light intensity distribution in the first embodiment.

Photomask 40 that has been plotted in Step S70 is next used to form a pattern on a wafer. FIG. 11 shows the results of a simulation of the distribution of light intensity when using photomask 40 to implement light exposure. Simulation was carried out for a case in which photomask pattern 41 on photomask 40 was the part that shielded light.

In addition, when carrying out the simulation, the following conditions were used as the exposure conditions:

| Laser: | KrF excimer laser (wavelength λ = 248 nm) |
|---|---|
| Reduction power: | 4 |
| Numerical Aperture: | 0.85 |
| Coherent factor (σ): | Light-shielding rate of 0.85, 4/5 annular illumination (diagonally incident light in which the central 80% of a round light source is blocked) |
| Photomask 40: | Half-tone phase difference shift mask having 6% transmittance and 180° phase difference |

In addition, when carrying out simulation, the line-and-space of design pattern 1 was 100 [nm]/100 [nm]. When carrying out rectangular approximation, the width in the Y-axis direction of each rectangle was 80 nm. The process bias Δ was uniformly +10 nm.

Region c shown in FIG. 11 is the region in which the light intensity that reaches the resist on the wafer is a maximum. In other words, this region c is the region in which light reaches the wafer at almost the original intensity virtually unaffected by the light shielding part. Line b shown in FIG. 11 is the position at which the light intensity exhibits a particular fixed value lower than region c. Line a shown in FIG. 11 is the position at which light exhibits a particular fixed value that is even lower than the portion of line b.

As shown in FIG. 11, the side portions of photomask pattern 41 formed on photomask 40 form a stepped shape, but regions that are exposed at a particular fixed light intensity (the portions of line a and line b) on the wafer are lines that extend diagonally without exhibiting a stepped shape. This form is realized because the width (80 nm) of sides that extend in the Y-axis direction of the stepped portion is smaller than resolving power R (approximately 100 nm) under the above-described exposure conditions. In other words, the side portions of the pattern that is formed on the wafer are linear and lack a stepped shape. In addition, the width of the pattern formed on the wafer can be adjusted by adjusting the amount of light exposure at the time of exposure.

As described hereinabove, the present embodiment enables matching of the Y coordinates of the side portions (26a and 26b) of the irradiation pattern through the implementation of the Y-axis direction correction process (S40) before the second correction process (S60). In this way, an increase in the number of rectangles contained in the irradiation pattern can be avoided, and as a result, the plotting time when plotting photomask 40 can be shortened.

Although a case was described in the present embodiment in which process bias Δ was calculated by control device 22, the present invention is not limited to the calculation of process bias Δ by control device 22, and process bias Δ may of course be calculated by another calculation means other than the control device. In addition, the calculation of process bias Δ may be realized at any stage as long as this calculation precedes the first correction process (S40). However, when process bias Δ fluctuates due to the dimensions of the design pattern while calculating process bias Δ, the calculation of process bias Δ must follow the determination of the layout of the design pattern.

In addition, a case was described in the present embodiment in which side portions 7 of Y-axis direction correction pattern 6 were shifted (expanded) in the X-axis direction by X-axis direction correction processor 37. However, when exposing the wafer to light, Y-axis direction correction pattern 6 may not necessarily be expanded by shifting in the X-axis direction in cases in which the width of the pattern can be adjusted by adjusting the amount of exposure. In such cases, all of design pattern 1 must be a diagonal pattern.

On the other hand, when at least one portion of the side portions of the design pattern are parallel to the X-axis direction or Y-axis direction, the pattern formed on the wafer may not achieve the desired width even when the amount of light exposure is varied to adjust the width of diagonal patterns. Thus, in such cases, a pattern of the desired width equal to the width of design pattern 1 can be formed on the wafer by widening side portions 7 of Y-axis direction correction pattern 6 in the X-axis direction as described hereinabove.

In a pattern having a large number of lines, a process that employs the above-described negative resist is normally used because such a process is advantageous from the viewpoint of plotting time (number of shots). However, a positive resist process can also be used. When a positive resist is used, the space between line patterns becomes the plotting data. In this case, line patterns must be generated in CAD (Computer-Aided Design) data after the process bias process has been applied to the plotting data of this space such that continuous rectangle data are produced. For this purpose, the division of a single diagonal line pattern must take into consideration the division of other adjacent patterns, but the present invention can be similarly applied.

In addition, the present invention can be similarly applied when using a mask having a preponderance of spaces rather than lines. In such cases, a positive resist is used when fabricating a photomask, and space data produced by CAD data are plotted. When a positive resist is used, process bias $\Delta$ is normally a "– (minus)" value, because the main origin of the process bias is the recession of the resist produced during etching of the light-shielding film of the mask. In other words, the dimensions of the spaces plotted by a positive resist tend to widen in the process of etching the light-shielding film of a mask.

Second Embodiment

Explanation next regards the second embodiment. In the configuration of the plotting system of the present embodiment, the functional configuration of irradiation pattern generation program 30 differs from that of the first embodiment. Components having the same functional configuration as the first embodiment are given the same reference numbers and explanation of these items may be here omitted.

Figure 12:
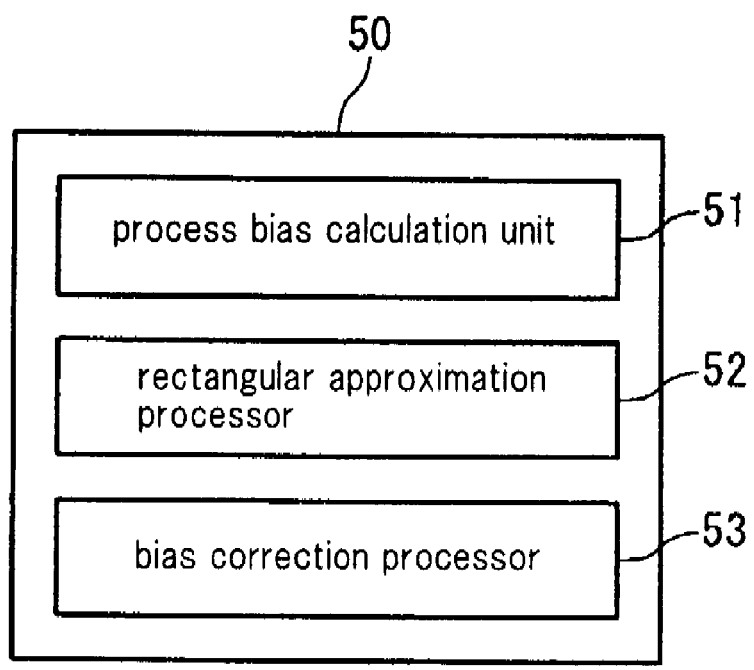
FIG. 12 is a schematic view of the configuration of the plotting system in the second embodiment.

FIG. 12 is a block diagram showing the content of irradiation pattern generation program 50 of the present embodiment. Irradiation pattern generation program 50 includes process bias calculation unit 51, rectangular approximation processor 52, and bias correction processor 53. In addition, the functions of process bias calculation unit 51 are the same as process bias calculation unit 51 in the first embodiment, and explanation of this part is therefore here omitted. However, the functions of rectangular approximation processor 52 differ from those of rectangular approximation processor 32 in the first embodiment. Bias correction processor 53 realizes substantially the same functions as second correction processor 34 in the first embodiment.

Figure 13:
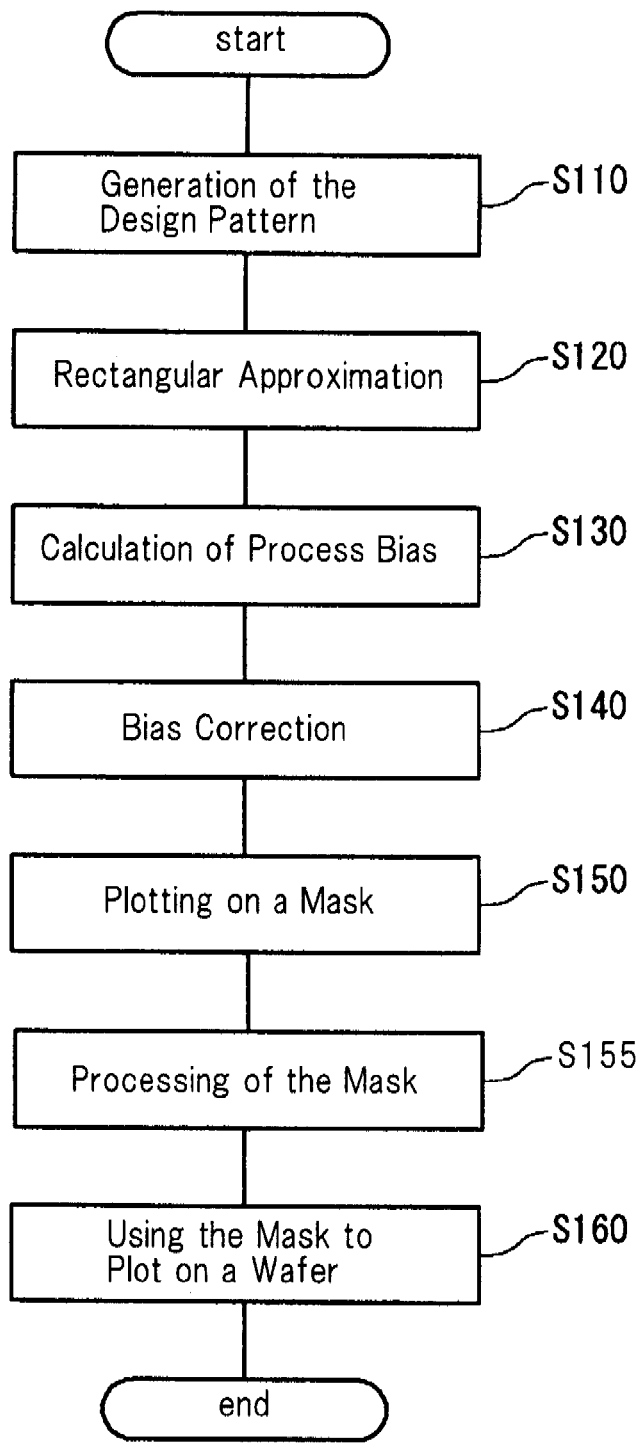
FIG. 13 is a flow chart of the irradiation pattern data generation method in the second embodiment.

FIG. 13 is a flow chart of the semiconductor wafer plotting method that includes the irradiation pattern data generation method of the present embodiment. As shown in FIG. 13, irradiation pattern data are generated in the process of Steps S110-S140. An irradiation pattern is formed on a resist based on the irradiation pattern data in the process of Step S150. This irradiation pattern is used to form a photomask pattern on a photomask in the process of Step S155. Finally, a pattern is formed on a wafer in the process of Step S160. Details of each process are next described.

Step S110: Generation of a Design Pattern

Desired design pattern 1 is first generated and then read to control device 22. This process is identical to the first embodiment and detailed explanation is therefore here omitted.

Step S120: Calculation of Process Bias

Process bias $\Delta$ is next calculated by process bias calculation unit 51. This process is identical to the first embodiment and detailed explanation is therefore here omitted. In addition, if this process precedes the bias correction process (Step S140) described below, it may be implemented at any stage.

Step S130: Rectangular Approximation

Figure 14A:
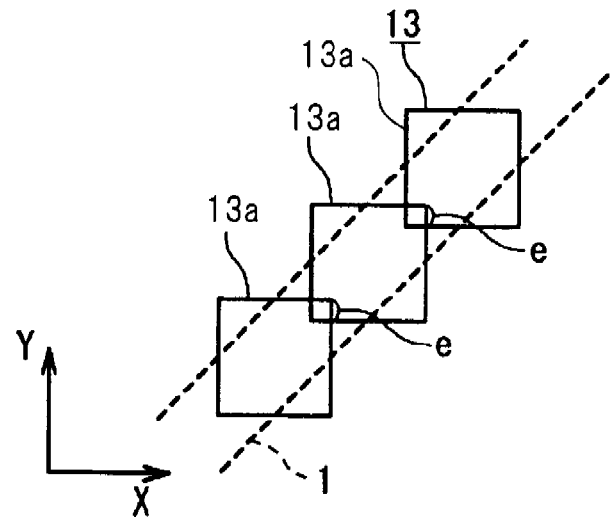
FIGS. 14A, 14B, and 14C are views for explaining the irradiation pattern data generation method of the second embodiment.

Rectangular approximation processor 52 next approximates design pattern 1 by at least one rectangle to generate rectangular approximation pattern 13. FIG. 14A shows this rectangular approximation process. When implementing the rectangular approximation, approximation is carried out such that each of rectangles 13*a* that make up rectangular approximation pattern 13 is formed by sides parallel to the X-axis direction and the Y-axis direction. In addition, approximation is carried out such that the length of sides in the X-axis direction of each of rectangles 13*a* is equal to the width in the X-axis direction of design pattern 1. The processing to this point is identical to that of the first embodiment. In the present embodiment, however, when process bias $\Delta$ calculated in Step S120 is a "+ (plus)" value, i.e., when the dimensions of rectangular approximation pattern 13 are larger by process bias $\Delta$ than the dimensions of design pattern 1, approximation is carried out such that each rectangle 13*a* overlaps with an adjacent rectangle 13*a* at least at a portion along the width. In FIG. 14A, adjacent rectangles 13*a* overlap along width e with respect to the Y-axis direction.

Step S140: Bias Correction

Figure 14B:
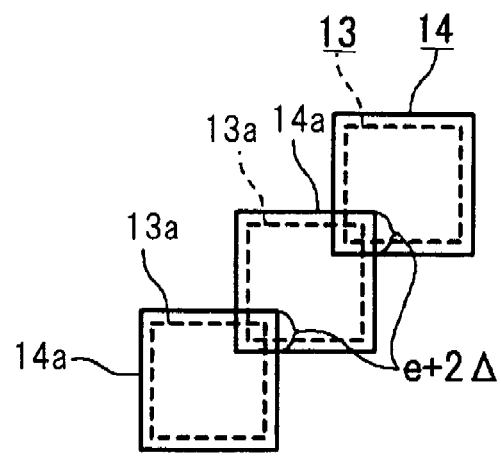

Bias correction processor 53 next expands rectangular approximation pattern 13 by process bias $\Delta$ to generate bias correction pattern 14. This process is substantially the same as the second correction process in the first embodiment. FIG. 14B shows bias correction pattern 14. The portion in which rectangles 14*a* overlap each other is expanded by $\Delta$ on one side. Accordingly, adjacent rectangles 14*a* overlap over a width of (e+2$\Delta$) with respect to the Y-axis direction.

Figure 14C:
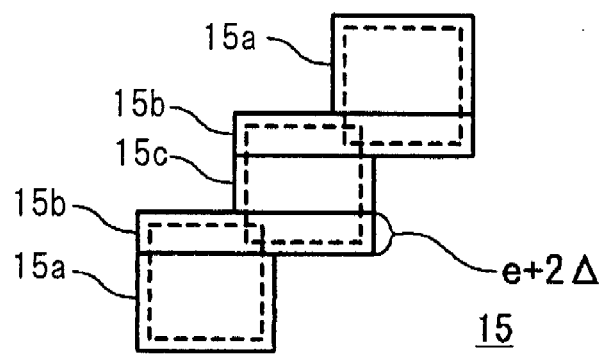

This rectangular approximation pattern 13 can be replaced by a plurality of rectangles 15*a*, 15*b*, and 15*c* that are adjacent in the Y-axis direction. FIG. 14C shows bias correction pattern 14 when converted to irradiation pattern 15 made up from the plurality of rectangles 15*a*, 15*b*, and 15*c* that are adjacent in the Y-axis direction. Of the plurality of rectangles 15*a*, 15*b*, and 15*c*, the width in the Y-axis direction of rectangles 15*b* that corresponds to the portion of overlap between rectangles 14*a* is (e+2$\Delta$). As shown in FIG. 14C, the information that represents irradiation pattern 15 made up from rectangles 15*a*, 15*b*, and 15*c* that are adjacent in the Y-axis direction is generated as irradiation pattern data by bias correction processor 53.

Steps S150, S155, S160: Mask Plotting, Mask Processing, and Using the Mask to Plot a Wafer As in the first embodiment, an electron beam is next irradiated on the resist based on the generated irradiation pattern data, following which the irradiation pattern 15 on the resist is formed by a development process (S150).

Using the resist on which irradiation pattern 15 is formed, a light-shielding film is next etched to form photomask pattern 41 on photomask 40 that is made up by the light-shielding film (S155).

Figure 15:
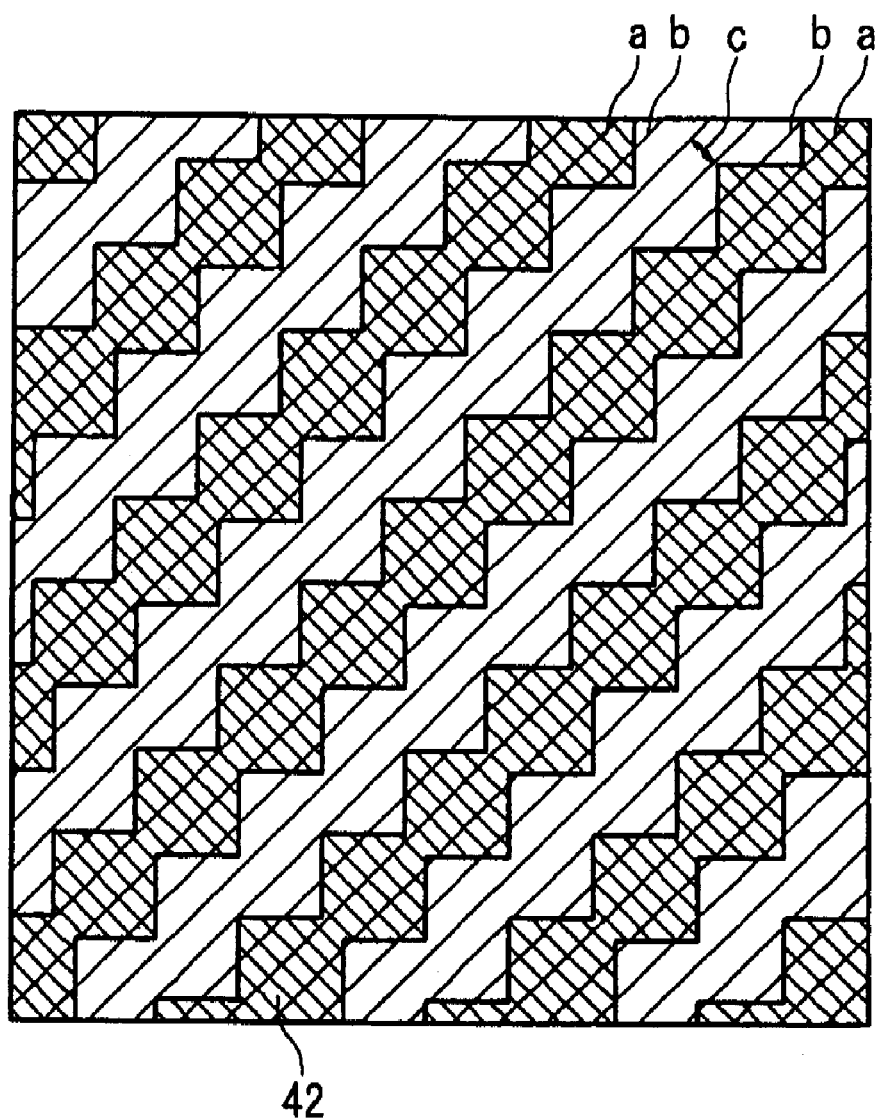
FIG. 15 is a view for explaining the simulation results of the light intensity distribution in the second embodiment.

As in the first embodiment, photomask 40 is finally used to form a pattern on a wafer (S160). FIG. 15 shows the result of simulating the light intensity distribution when using photomask 40 to carry out light exposure. The light exposure conditions are the same as in the first embodiment. As in the first embodiment, region c shown in FIG. 15 is the region of maximum light intensity that reaches the resist on the wafer. Line b shown in FIG. 15 is the position at which the light intensity exhibits a particular fixed value that is lower than region c. Line a shown in FIG. 15 is the position at which the light intensity exhibits a particular fixed value that is even lower than the portion of line b. As shown in FIG. 15, the side portions of the pattern formed on the wafer are linear even when the side portions of pattern 42 on photomask 40 are in a stepped shape.

Figure 16A:
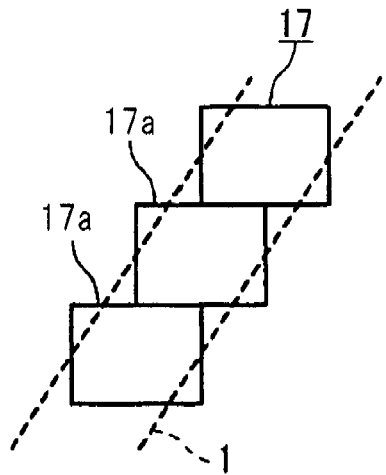
FIGS. 16A, 16B, and 16C are views for explaining the irradiation pattern data generation method in a comparative example.
Figure 16B:
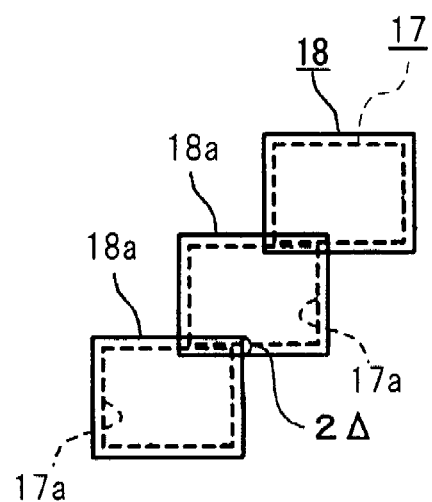
Figure 16C:
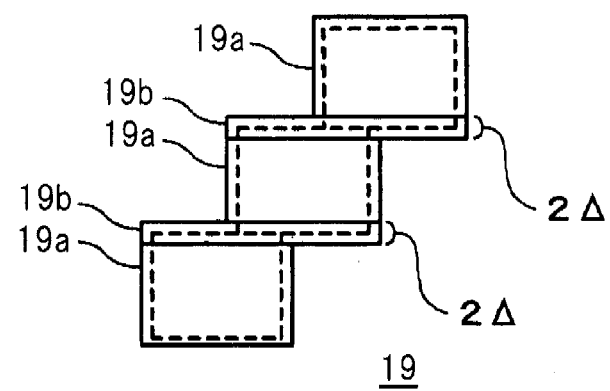

As a comparative example, FIGS. 16A-16C show a case in which, in the rectangular approximation process, approximation is carried out such that adjacent rectangles share sides, i.e., the overlapping portions of adjacent rectangles are lines and these overlapping portions do not have a width. FIG. 16A shows rectangular approximation pattern 17 after the rectangular approximation process. FIG. 16B shows bias correction pattern 18 after the bias correction process. As shown in FIG. 16B, adjacent rectangles 18a in bias correction pattern 18 overlap in regions having a width of 2Δ in the Y-axis direction. FIG. 16C shows the state when this bias correction pattern 18 is represented by a plurality of rectangles 19a and 19b that are adjacent in the Y-axis direction. In other words, FIG. 16C shows irradiation pattern 19 in the comparative example. In this irradiation pattern 19, rectangles 19b that correspond to the portions in which rectangles 18a overlap in bias correction pattern 18 have a width in the Y-axis direction of only 2Δ and form minute rectangles.

Comparing irradiation pattern 15 in the present embodiment with irradiation pattern 19 in the comparative example, the width in the Y-axis direction of rectangles 15b in irradiation pattern 15 in the present embodiment is (e+2Δ), whereby the width is increased over the comparative example by the differential "e." In other words, the present embodiment prevents rectangles 15b contained in irradiation pattern 15 from being minute, whereby the dimensional accuracy when forming a pattern on a photomask can be improved.

Of the rectangles 15a, 15b, and 15c that make up irradiation pattern 15, the width in the Y-axis direction of rectangles 15c that correspond to the portions in which adjacent rectangles 14a do not overlap in bias correction pattern 14 is reduced from the corresponding dimension in the comparative example. However, this presents no problem if the width in the Y-axis direction of each of rectangles 13a that make up rectangular approximation pattern 13 is sufficiently increased with respect to "e" in the rectangular approximation process.

In the above-described embodiments, cases were described in which a CAD data component is converted to plotting data and a negative resist is used in plotting a mask. However, a light-dark inverted pattern of the CAD data may also be taken as the plotting data and a positive resist used in the mask plotting. The determination of which of a negative resist and positive resist is to be used depends on the plotting time. Typically, a positive resist is used in processes in which the plotting rectangles (plotting time) is short.

When a positive resist is used, the process bias is conferred to plotting data as a "− (minus)" value. This is because, whether the process uses a positive resist or a negative resist, etching encroaches on the resist and the dimensions of the resulting EB (electron beam) resist must therefore be augmented. The present invention can be applied even when a positive resist is used in this way, and obtains the effect of allowing a reduction of the number of rectangles of the actual plotting data after the process bias process.

Although a certain preferred embodiments of the present invention have been shown and described in detail, it should be understood that various changes and modifications may be made without departing from the spirit or scope of the appended claims.

What is claimed is:

1. An irradiation pattern data generation method for indicating an irradiation pattern when plotting on an object of plotting by energy irradiation according to a variable rectangle mode, said irradiation pattern data generation method comprising:
generating, with a rectangular approximation process, a rectangular approximation pattern for a design pattern having diagonal side parts that extend diagonally with respect to an X-axis direction and a Y-axis direction on an XY plane, in which said design pattern is approximated as rectangles;
moving, with a first correction process, side portions of said rectangular approximation pattern in said Y-axis direction to generate a first correction pattern;
expanding, with a second correction process, the side portions of said first correction pattern in said X-axis direction and said Y-axis direction to generate an irradiation pattern; and
plotting, with a plotting device, said radiation pattern upon said object of plotting by irradiating energy upon said object of plotting in said irradiation pattern.

2. The irradiation pattern data generation method according to claim 1, wherein:
in said first correction process, the side portions of said rectangular approximation pattern are moved by a process bias Δ that is equal to an amount of reduction of a formation pattern that is actually formed on an object of plotting with respect to said irradiation pattern; and
in said second correction process, the side portions of said first correction pattern are expanded by said process bias Δ in said X-axis direction and said Y-axis direction.

3. The irradiation pattern data generation method according to claim 2, wherein said first correction process includes a Y-axis direction correction process for shifting the side portions of said rectangular approximation pattern exactly by said process bias Δ in said Y-axis direction to generate a Y-axis direction correction pattern.

4. The irradiation pattern data generation method according to claim 3, wherein:
in said rectangular approximation process, an approximation is carried out such that each of said rectangles that make up said rectangular approximation pattern is formed by sides parallel to said X-axis direction and said Y-axis direction, and such that a length of each of said rectangles in said X-axis direction is equal to a dimension parallel to said X-axis direction between said diagonal side portions in said design pattern; and
in said Y-axis direction correction process, the side portions of said rectangular approximation pattern are shifted exactly by the amount of said process bias Δ in a direction parallel to said Y-axis direction and moreover toward an interior of said rectangular approximation pattern.

5. The irradiation pattern data generation method according to claim 4, wherein:
said first correction process further includes an X-axis direction correction process that is carried out after said Y-axis direction correction process; and
in said X-axis direction correction process, side portions of said Y-axis direction correction pattern are shifted in a direction parallel to said X-axis direction, and moreover, away from said Y-axis direction correction pattern.

6. The irradiation pattern data generation method according to claim 4, wherein, in said rectangular approximation process, said rectangular approximation pattern is generated such that at least a portion of sides that extend in said X-axis direction are shared by adjacent rectangles.

7. The irradiation pattern data generation method according to claim 1, wherein said rectangular approximation process, said first correction process, and said second correction process are executed by a computer.

8. An irradiation pattern data generation method for generating irradiation pattern data when plotting on an object of plotting by energy irradiation according to a variable rectangle mode; said irradiation pattern data generation method comprising:
approximating, with a rectangular approximation process, diagonal side portions of a design pattern having said diagonal side portions that extend diagonally with respect to an X-axis direction and a Y-axis direction on an XY plane, as at least one rectangle to generate a rectangular approximation pattern;

expanding, with a bias correction process, said rectangular approximation pattern exactly by a process bias Δ, which is equal to an amount of reduction of a formation pattern actually formed on an object of plotting with respect to an irradiation pattern, to generate said irradiation pattern; and plotting, with a plotting device, said radiation pattern upon said object of plotting by irradiating energy upon said object of plotting in said irradiation pattern, wherein:

in said rectangular approximation process, approximation is carried out such that each of said rectangles that make up said rectangular approximation pattern is formed by sides that are parallel to said X-axis direction and said Y-axis direction and is formed such that a length in said X-axis direction of each said rectangle equals a dimension parallel to the X-axis direction between said diagonal side portions in said design pattern; and approximation is carried out such that, when the dimensions of said rectangular approximation pattern are made larger than the dimension of said design pattern by said process bias Δ, each of said rectangles that are adjacent overlap along at least a portion of sides that extend in said X-axis direction.

9. An irradiation pattern data generation program for causing a computer to execute the irradiation pattern data generation method according to claim 8.

10. A photomask fabrication method comprising:

irradiating, with a first process, energy upon an object of plotting based on irradiation pattern data that have been generated by the irradiation pattern data generation method according to claim 8; and irradiating energy upon a photomask with a second process of using the irradiation pattern formed by said first process.

11. A plotting system comprising:

a plotting device for plotting by irradiating energy onto an object of plotting by a variable rectangle mode; and a control device for controlling operation of said plotting device;

wherein said control device includes:

a rectangular approximation processor for approximating a design pattern having diagonal side portions that extend diagonally with respect to an X-axis direction and a Y-axis direction on an XY plane as rectangles to generate a rectangular approximation pattern;

a first correction processor for, based on said rectangular approximation pattern, generating a first correction pattern; and a second correction processor for generating an irradiation pattern based on said first correction pattern; wherein:

said first correction processor includes a Y-axis direction correction processor that shifts step-shaped side portions of said rectangular approximation pattern that corresponds to said diagonal side portions exactly by a process bias Δ in the Y-axis direction to generate a Y-axis direction correction pattern;

said second correction processor enlarges said first correction pattern by the process bias Δ, which is equal to an amount of reduction of a formation pattern actually formed on an object of plotting with respect to an irradiation pattern, to generate said irradiation pattern; and said plotting device irradiates energy upon the object of plotting in said irradiation pattern that has been generated by said control device.

12. The plotting system according to claim 11, wherein said plotting device is an electron beam irradiation device.

13. A plotting system comprising:

a plotting device for plotting by irradiating energy onto an object of plotting by a variable rectangle mode; and a control device for controlling operation of said plotting device;

wherein said control device includes:

a rectangular approximation processor for approximating diagonal side portions of a design pattern that includes said diagonal side portions that extend diagonally with respect to an X-axis direction and a Y-axis direction on an XY plane as rectangles to generate a rectangular approximation pattern; and a bias correction processor for expanding said rectangular approximation pattern by a process bias Δ, which is equal to the an amount of reduction of a formation pattern actually formed on an object of plotting with respect to an irradiation pattern, to generate said irradiation pattern;

wherein:

said rectangular approximation processor carries out approximation such that each of said rectangles that make up said rectangular approximation pattern is formed by sides that are parallel to said X-axis direction and said Y-axis direction, and such that a length of said rectangles in said X-axis direction equals a dimension parallel to said X-axis direction between said diagonal side portions in said design pattern;

said rectangular approximation processor carries out approximation such that, when the dimension of said rectangular approximation pattern is made larger than the dimension of said design pattern by said process bias Δ, said rectangles that are adjacent overlap at least a portion of sides that extend in said X-axis direction; and said plotting device irradiates energy upon the object of plotting in said irradiation pattern that has been generated by said control device.

14. The plotting system according to claim 13, wherein said plotting device is an electron beam irradiation device.

* * * * *

UNITED STATES PATENT AND TRADEMARK OFFICE
CERTIFICATE OF CORRECTION

PATENT NO. : 7,810,066 B2
APPLICATION NO. : 11/866699
DATED : October 5, 2010
INVENTOR(S) : Tadao Yasuzato Page 1 of 1

It is certified that error appears in the above-identified patent and that said Letters Patent is hereby corrected as shown below:

IN THE SPECIFICATIONS:
Column 9, Line 62: Delete "R $(=k1 \times \lambda NA)$" and insert -- R $(=k1 \times \lambda / NA)$ --

IN THE CLAIMS:
Column 16, Line 8: In Claim 1, delete "radiation" and insert -- irradiation --

Column 17, Line 11: In Claim 8, delete "radiation" and insert -- irradiation --

Column 18, Line 31: In Claim 13, After "to" delete "the".

Column 18, Line 48: In Claim 13, delete "at least" and insert -- at at least --

Signed and Sealed this
Twenty-fifth Day of January, 2011

David J. Kappos
*Director of the United States Patent and Trademark Office*